United States Patent [19]

Possati et al.

[11] 4,277,121
[45] Jul. 7, 1981

[54] DRAWER FOR ELECTRIC CABINETS

[75] Inventors: Mario Possati; Giuliano Longhi, both of Bologna, Italy

[73] Assignee: Finike Italiana Marposs S.p.A., S. Marino di Bentivoglio, Italy

[21] Appl. No.: 103,359

[22] Filed: Dec. 13, 1979

[30] Foreign Application Priority Data

Dec. 21, 1978 [IT] Italy .............................. 3628 A/78
Dec. 21, 1978 [IT] Italy .............................. 3629 A/78

[51] Int. Cl.³ ...................... A47B 88/00; A47B 95/02
[52] U.S. Cl. ................................. 312/320; 312/242; 312/257 A; 248/316 B; 248/490
[58] Field of Search .................. 312/320, 242, 257 A, 312/7 R; 248/488, 490, 316 B

[56] References Cited

U.S. PATENT DOCUMENTS

| | | | |
|---|---|---|---|
| 1,789,740 | 1/1931 | Gelette | 248/488 |
| 2,206,775 | 7/1940 | Hoofer | 248/488 |
| 3,008,249 | 11/1961 | Masters | 248/488 |
| 3,276,834 | 10/1966 | Greenwald et al. | 312/242 |
| 3,421,272 | 1/1969 | Jamar, Jr. | 248/316 B |
| 3,567,303 | 3/1971 | Fox et al. | 312/320 |
| 3,621,510 | 11/1971 | Rollins, Jr. | 312/320 |
| 4,002,381 | 1/1977 | Wagner et al. | 312/320 |
| 4,002,386 | 1/1977 | McKenzie | 312/320 |
| 4,014,598 | 3/1977 | Stalley et al. | 312/320 |

*Primary Examiner*—Victor N. Sakran
*Attorney, Agent, or Firm*—Stevens, Davis, Miller & Mosher

[57] ABSTRACT

A drawer for electric cabinets including a frame, at least a removable front panel and a locking device for locking the panel to the frame. The locking device comprises two horizontal cross-members rotatable about axes defined by the frame and includes channel shaped parts to grip edges of the panel. Two handle blocks fixed to the frame have relevant handles, which may act as hinge elements for cooperating with other hinge elements fixed to the panel, in order to provide a temporary support and swinging device for the panel when it is removed from the frame.

14 Claims, 9 Drawing Figures

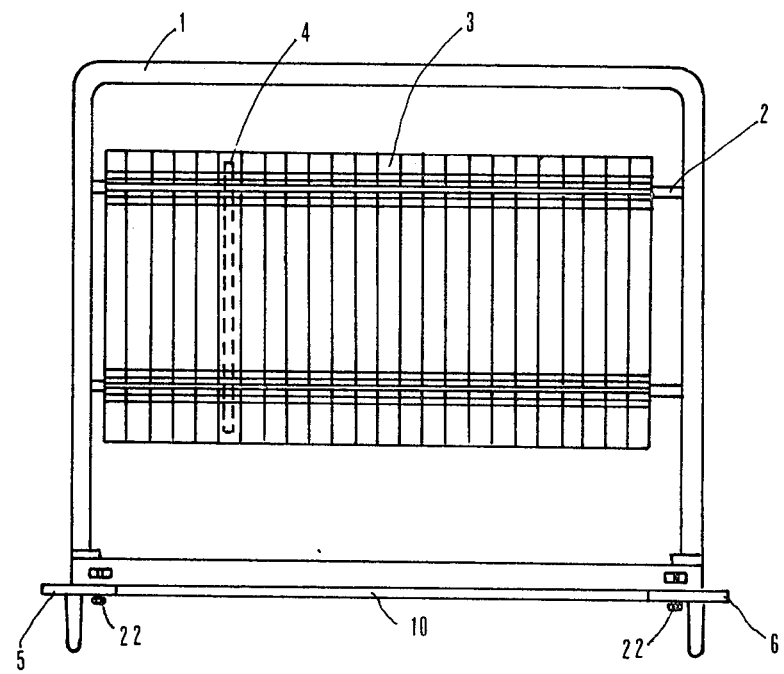
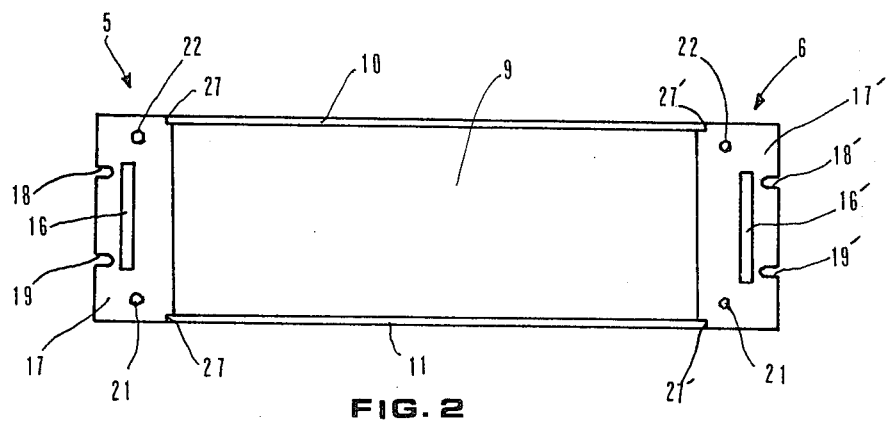

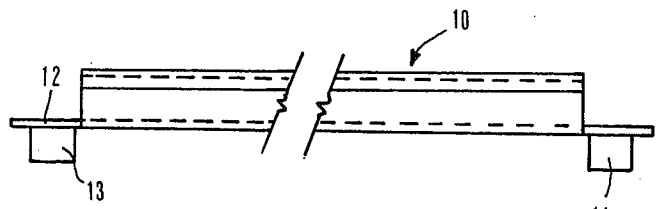
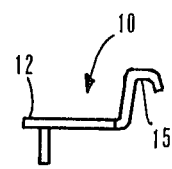
FIG. 3  FIG. 4
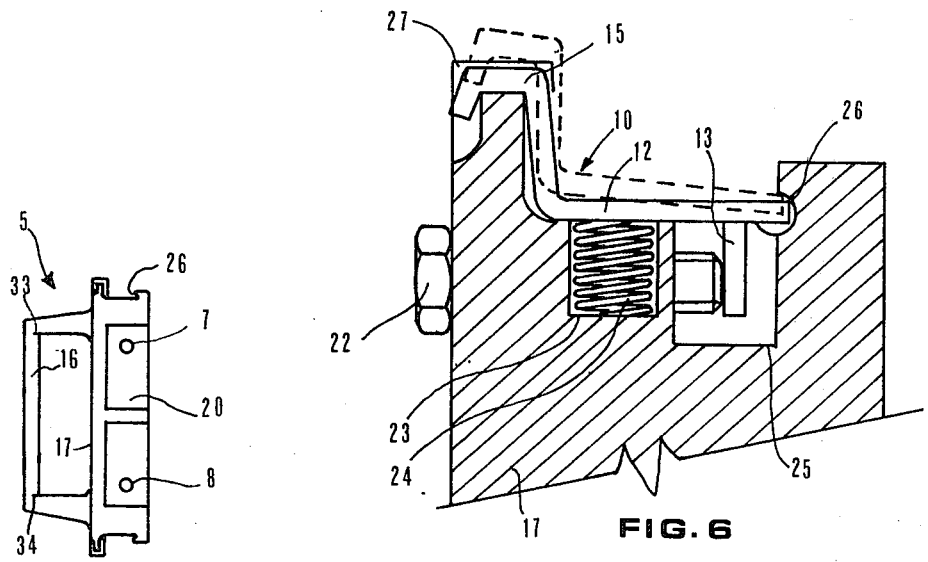
FIG. 5  FIG. 6
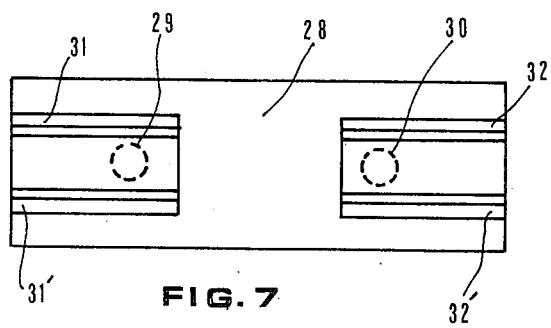
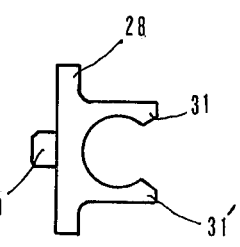
FIG. 7  FIG. 8

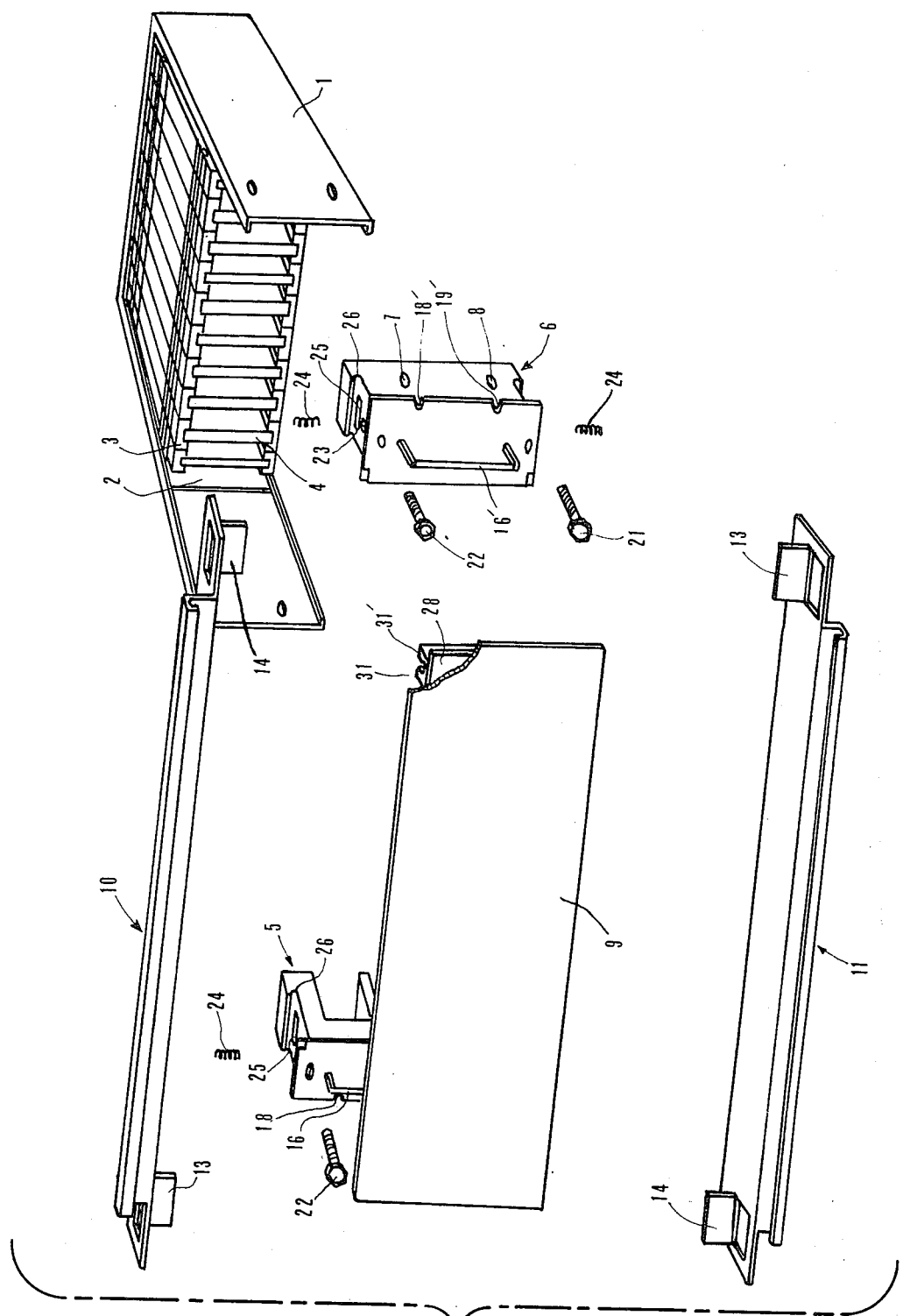

DRAWER FOR ELECTRIC CABINETS

The present invention relates to a drawer for electric cabinets, with a frame, at least a removable front panel and a locking device for rigidly locking the panel to the frame, and for permitting removal of the panel.

A drawer for electric cabinets generally includes one or more rigid frames adapted to support electric circuits, one or more removable panels and handles for facilitating pulling-in and pulling-out of the drawer with respect to the cabinet.

The panels are elements for closing the front side of the drawer and in some cases also have the task of supporting further electric circuits.

In already known drawers for electric cabinets, the panels are coupled to the frames by screws permitting removal of the panels in case it is necessary to operate on the electric circuits supported by the frames or by the panels for repair or similar purposes. This arrangement permits coupling the panels to the frames by inexpensive elements, i.e. screws, but requires long assembling and disassembling operations, particularly when to each frame there are coupled several small panels, instead of a single panel. Moreover, when the panels must be removed for permitting operation on the electric circuits, in case there are electrical connections between the panel and the circuits supported by the frame, and these connections must remain operative, it is difficult to maintain the panels in positions enabling easy operation, good accessibility and such as to prevent possible damages to the connections and the circuits.

In other known drawers for electric cabinets, the panels are coupled to the frame by the combined action of hinges—each hinge having a first element fixed to the frame and a second element fixed to the panel—and of locking means, such as screws, adapted to prevent swinging of the panel with respect to the frame. When it is necessary to operate on the circuits supported by the panel and/or by the frame, the locking means are removed and the panel is swung about the hinges. This structure is not adapted for a drawer comprising several small panels and does not offer good accessibility to the electric circuits.

A first object of the present invention is to provide a drawer with a device for locking the panel to the frame, which is low cost and permits easy locking either a single panel or several small panels without having to change the frame structure.

A second object of the invention is to provide a drawer with a device for locking and unlocking the panels which guarantees good accessibility of the electric circuits, facilitates the operations for coupling and disjoining the panels with respect to the frame and permits, in working conditions, a stable coupling between the panels and the frame.

Another object of the invention is to provide a drawer with a device facilitating operations on the electric circuits when the panel or panels are removed from the drawer frame.

These and other objects and advantages are obtained by a drawer of the type specified at the beginning of this description in which, according to the invention, the locking device comprises at least one movable element adapted to cooperate with the frame—the movable element having grip surfaces adapted to cooperate with the panel; and control means adapted to act on the movable element to control a closing movement of it and bring the grip surfaces into contact with the panel, for locking the panel to the frame.

According to another feature of the invention, the drawer comprises hinge means including at least a first hinge element coupled to the frame and a second hinge element coupled to the panel, the two hinge elements being disjoined in normal working conditions of the electric cabinet and being adapted to be coupled to each other after removal of the panel from the frame, for permitting temporary support and swinging of the panel.

The invention is illustrated, according to the preferred embodiment, in the annexed drawings in which:

FIG. 1 shows a plan view of a drawer for electric cabinets;

FIG. 2 is a front view of the drawer;

FIG. 3 is a front view of a movable element of the device for locking the panel to the frame of the drawer;

FIG. 4 is a side view of the element of FIG. 3;

FIG. 5 shows an element comprising a handle and parts of the locking device;

FIG. 6 shows a cross-section of a detail of the drawer and illustrates the operation of the locking device.

FIG. 7 is a front view of a hinge element adapted to be fixed to the panel of the drawer of FIGS. 1 to 6; and FIG. 8 is a side view of the hinge element of FIG. 7;

FIG. 9 is an expanded view showing the complete combination of the device of the invention.

With reference to FIGS. 1 and 2, the drawer includes an outer frame 1 consisting of a single steel plate bent to U shape and an inner frame 2 including four rods rigidly connected to the outer frame 1.

Supporting elements or cross-pieces 3 are coupled to the inner frame 2 by means of coupling parts constituted, in substance, by open eyelets delimited by protruding walls resiliently deformable. Cross-pieces 3 support and guide printed-circuit cards, one of which, 4, is shown in FIG. 1 by dashed lines.

Coupling of cross-pieces 3 to the rods of inner frame 2 is carried out by pushing the cross-pieces, from the inside towards the outside of frame 2, in a direction perpendicular to the rods, until the rod concerned enters into the eyelets of the cross-pieces 3.

Each card 4 is supported by two opposite cross-pieces 3. Each cross-piece 3 may be coupled to or disjoined from frame 2 by operations not involving the other cross-pieces.

Two elements 5 and 6 which hereinafter will be called handle-blocks are rigidly connected to the outer frame 1 by screws coupled to threaded holes 7 and 8, shown in FIG. 5.

The drawer further includes a removable panel 9 having a perimeter substantially rectangular and two horizontal cross-members 10 and 11, which constitute the movable elements of the device for locking the panel 9 to the outer frame 1.

Cross-members 10 and 11, one of which, 10, is shown in FIGS. 3 and 4, are obtained by shaping a steel plate and comprise a base element 12 with two protruding parts or reference surfaces 13 and 14, perpendicular to the base element 12 and obtained by cutting and bending two parts of element 12.

Cross-members 10 and 11 also comprise a plate section, substantially perpendicular to the base element 12 and shaped in such a way as to form a channel contour 15 adapted to cooperate with panel 9 and handle blocks 5, 6 to rigidly connect the panel to frame 1.

As shown in FIGS. 2 and 5, each handle block 5, 6 is formed as a single piece by pressure die-casting and includes a cylindrical handle 16, 16' which serves for facilitating pulling-in and pulling-out operations of the drawer, a front element 17, 17' on which there are formed slots 18,19; 18', 19'—which serve to house screws for locking the drawer to the cabinet—and a back portion 20 with threaded holes (not shown) to which are coupled screws 21 and 22 adapted to cooperate with the reference surfaces 13 and 14 of cross-members 10 and 11.

In the back portion 20 of each handle block 5 and 6 are obtained, as may be noticed from FIGS. 5 and 6, seats 23 for helical springs 24, recesses 25 for housing protruding parts 13 and 14 of cross-members 10 and 11 and grooves 26 adapted to define horizontal fulcrums of instantaneous pivoting for cross-members 10 and 11. Cross-members 10 and 11 are supported by handle blocks 5 and 6 through helical springs 24 and the grooves 26, which cooperate with the base element 12 of each cross-member.

The axial positioning of cross-members 10 and 11 is assured by references 27, 27' obtained in the handle blocks 5 and 6.

The handle 16,16' of each handle block 5 and 6 acts as a fixed element of a cylindrical hinge the movable element of which is constituted by a second element fixed to panel 9.

The second element of the hinge, shown in FIGS. 7 and 8, is constituted by a base support 28 which carries at one side two inserts 29 and 30 and at the other side two pairs of resilient elements 31,31', 32, 32', which, by cooperating with handle 16 or 16', forming a cylindrical hinge.

Handle 16 comprises, as handle 16', two reference surfaces 33 and 34—adjacent to the ends of handle 16—which, by cooperating with the external bases of resilient elements 31, 31', 32, 32', prevent vertical sliding of the two elements of the cylindrical hinge.

The movable element of the hinge is fixed to panel 9 by the combined actions of an adhesive and of the two inserts 29 and 30, which are inserted by interference fit into suitable seats obtained in the panel and have the function to guarantee a safe coupling even if the effect of the adhesive fails.

Resilient elements 31, 31', 32, 32' define open eyelets limited by two resilient walls.

The coupling of the two elements, one fixed and the other movable, adapted to provide a cylindrical hinge, is obtained by pushing the movable hinge element, fixed to the panel, in a direction perpendicular to handle 16 or 16' until the same handle enters into the eyelets.

The operation of one of the devices for locking panel 9 to frame 1 is illustrated in FIG. 6 which shows a detail of the upper part of handle block 5. The lower part of handle block 5, not shown in FIG. 6, has a similar structure, as may be seen in FIG. 5.

When panel 9 is not fixed to frame 1, screws 22 are in loosened condition and cross-member 10 is in the position shown by dashed line. In order to lock panel 9, the latter is approached to frame 1 and by operating screws 21 (which were in loosened condition, too) and 22, cross-members 10 and 11 are caused to rotate about horizontal fulcrums defined by grooves 26 and panel 9 is consequently locked by channel contours 15, which close with a scissor-wise movement upon the horizontal edges of the panel and of handle blocks 5 and 6 and grip these edges.

From FIG. 6 it may be noticed that by tightening screw 22, the latter applies to protruding part 13 of cross-member 10 a force which produces, with respect to the fulcrum defined by one of the generatrices of groove 26, a moment capable of overcoming the resilient reaction of helical spring 24 and of producing the rotation of cross-member 10 about the above-mentioned fulcrum. Base element 12 acts as a rotating arm coupling protruding part 13 with channel contour 15.

Cross-members 10 and 11, in rest conditions, are not locked to outer frame 1 but are only supported by it; their rigid connection is obtained by acting on screws 21 and 22 during the locking operation of panel 9. In order to lock, or to remove panel 9 with respect to frame 1, it is therefore only necessary to act on screws 21 and 22, without removing them from their seats.

Therefore this device permits to render more rapid the operations for locking or removing the panel with respect to frame 1. The advantage is still bigger when several small panels are used in place of a single panel 9; in fact, whichever the number of the small panels may be, it is only necessary to operate on said screws 21 and 22. Moreover, when several small panels are used, the locking device guarantees their perfect alignment and prevents dust from entering into the drawer.

One variant with respect to the illustrated arrangement of the locking device may foresee the use of a single cross-member and the replacement of the second cross-member by a fixed channel obtained in the outer frame and capable of housing the lower edge of the panel. The latter arrangement permits further diminishing of the cost of the device and the time necessary to lock the panel, because the number of the screws to be operated is reduced to a half.

If the electric cabinet is provided with a plurality of drawers, each having a relevant panel, and/or if a drawer is provided with a plurality of small panels placed side by side, a relevant movable element of a cylindrical hinge is coupled at the vertical edge or edges of each panel in such a way that the longitudinal axis of the movable element is in a vertical direction. When it is necessary to operate on the electric circuits, these panels may be coupled to whichever handle of the cabinet, thus obtaining a very good accessibility of the circuits.

A possible variant—with respect to the illustrated embodiment—for cabinets having one or several drawers, foresees handles fixed to the panel or panels and fixed elements coupled to the supporting structure of the cabinet. These fixed elements may be obtained by a single vertical cylindrical rod defining horizontal reference surfaces. In this case the panel of a drawer may be hinged to the handle of another panel or to the cylindrical rod.

It is evident that other modifications and variants, equivalent from a functional or structural point of view, are possible without departing from the spirit of the invention.

What is claimed is:

1. Drawer for electric cabinets comprising a frame with a rectangular front opening, the frame defining stationary surfaces adapted to permit pivotal movements; a rectangular removable panel for closing said front opening; a locking device for rigidly locking the panel to the frame and for permitting removal of the panel, the locking device including a mobile horizontal cross-member, the cross-member defining a first portion, channel shaped, adapted to grip a corresponding edge of the panel, a second portion having a side adapted to be coupled with said stationary surfaces, and reference surfaces, the second portion defining an arm for controlling substantially vertical movements of the first portion with respect to the panel; control means, which cooperate with the mobile cross-member and with the frame, for coupling said stationary surfaces and said side of the second portion and for permitting substantially pivotal movements of the cross-member, the control means including mobile elements which cooperate with the reference surfaces for controlling said substantially pivotal movements of the cross-member for bringing the grip surfaces in contact with the panel and for moving the grip surfaces away from the panel for permitting a frontal removal of the panel.

2. The drawer according to claim 1, wherein the control means further comprise resilient means adapted to apply a thrust action to the cross-member to keep the side of the second portion in cooperation with the stationary surfaces.

3. The drawer according to claim 2, wherein said resilient means include springs associated with the frame and adapted to cooperate with said second portion for applying to it forces adapted to cause an opening movement of the cross-member as a substantial pivotal movement.

4. The drawer according to claim 3, wherein said mobile elements of the control means comprise screws associated with the frame and movable with respect to it for applying to said reference surfaces a thrust adapted to overcome the action of the springs and to cause a substantially pivotal closing movement of said cross-member.

5. The drawer according to claim 4, wherein the frame defines further stationary surfaces adapted to permit pivotal movements, and the locking device comprises a second horizontal cross-member similar to the first horizontal cross-member, with a second side adapted to be coupled to the further stationary surfaces, the resilient means comprising further springs associated with the frame and adapted to cooperate with the second portion of the second cross-member for applying to it forces adapted to control an opening movement of the second cross-member as substantially pivotal movement, the control means comprising further screws associated with the frame and movable with respect to it for applying to the reference surfaces of the second cross-member a thrust adapted to overcome the action of the further springs and to cause the substantially pivotal movement of the second cross-member.

6. The drawer according to claim 5, wherein the frame comprises a portion bent to U shape and two blocks, connected to the ends of the portion bent to U shape, the blocks including handles for facilitating pulling-in and pulling-out of the drawer, seats for said springs and further springs, seats for said screws and further screws, seats for the cross-member and the second cross-member, seats defining said stationary surfaces and the stationary surfaces of the second cross-member; and means for connecting the blocks to said ends and for coupling the drawer with the cabinet.

7. Drawer for electric cabinets comprising a frame with a front opening, the frame defining stationary surfaces adapted to permit pivotal movements; a removable panel for closing the front opening; a locking device for rigidly locking the panel to the frame and for permitting removal of the panel, the locking device including a mobile member with grip surfaces adapted to cooperate with the panel, and a portion adapted to be coupled with said stationary surfaces; control means cooperating with the mobile member and with the frame for coupling said stationary surfaces and said portion of the mobile member and for permitting substantially pivotal movements of the mobile member with respect to the frame, the control means including mobile elements which control said substantially pivotal movements for bringing the grip surfaces in contact with the panel and rigidly locking the panel to the frame, and for moving the grip surfaces away from the panel for permitting the removal of the panel from the frame; a first hinge element coupled to the frame; a second hinge element coupled to the panel, the two hinge elements being disjointed when the panel is locked to the frame by the locking device, and being adapted to be coupled to each other after removal of the panel from the frame, for permitting temporary support and swinging of the panel.

8. The drawer according to claim 7, comprising handles for facilitating pulling-in and pulling-out of the drawer, wherein said first hinge element is defined by any of the handles.

9. The drawer according to claim 7, wherein said second hinge element comprises at least one base element fixed to the panel and resilient side walls coupled to the base element, the resilient side walls defining eyelet openings adapted to grip the first hinge element.

10. The drawer according to claim 8, wherein said handles comprise a substantially cylindrical part, the cylindrical part defining said first hinge element, the handles defining base parts for providing stop reference surfaces for said second hinge element.

11. The drawer according to claim 9, wherein said base element is fixed to the panel by an adhesive and comprises inserts, the panel defining seats adapted to be coupled with the inserts by interference fit.

12. The drawer according to claim 8, wherein the frame comprises a portion bent to U shape and two blocks, connected to the ends of the portion bent to U shape, the blocks defining said handles and means for connecting the blocks to the frame and for coupling the drawer with the cabinet.

13. The drawer according to claim 12 or claim 6 wherein each block is obtained as a single piece by pressure die-casting.

14. Drawer for electric cabinets comprising a frame with a front opening, the frame defining stationary surfaces adapted to permit pivotal movements; a removable panel for closing the front opening; a locking device for rigidly locking the panel to the frame and for permitting removal of the panel, the locking device including a movable member with grip surfaces adapted to cooperate with the panel, the movable member having a portion adapted to be coupled with said stationary surfaces; control means cooperating with the movable member and with the frame for coupling said stationary surfaces and said portion of the movable member and for permitting substantially pivotal movements of the movable member with respect to the frame, the control means including mobile elements which control said substantially pivotal movements for bringing the grip surfaces in contact with the panel and rigidly locking the panel to the frame, and for moving the grip surfaces away from the panel for permitting the removal of the panel from the frame.

* * * * *